(12) United States Patent
Shen et al.

(10) Patent No.: US 9,439,309 B2
(45) Date of Patent: Sep. 6, 2016

(54) ELECTRONIC APPARATUS AND CONTROLLING METHOD THEREOF

(71) Applicants: Chun-Te Shen, Taipei (TW);
Yung-Ming Tien, Taipei (TW);
Chih-Tarng Chuang, Taipei (TW);
Hong-Tien Wang, Taipei (TW);
Shi-Kuan Chen, Taipei (TW);
Shih-Chin Gong, Taipei (TW);
Yung-Hsiang Chen, Taipei (TW);
Wei-Chih Hsu, Taipei (TW)

(72) Inventors: Chun-Te Shen, Taipei (TW);
Yung-Ming Tien, Taipei (TW);
Chih-Tarng Chuang, Taipei (TW);
Hong-Tien Wang, Taipei (TW);
Shi-Kuan Chen, Taipei (TW);
Shih-Chin Gong, Taipei (TW);
Yung-Hsiang Chen, Taipei (TW);
Wei-Chih Hsu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 315 days.

(21) Appl. No.: 13/968,437

(22) Filed: Aug. 16, 2013

(65) Prior Publication Data
US 2014/0049147 A1 Feb. 20, 2014

Related U.S. Application Data

(60) Provisional application No. 61/684,137, filed on Aug. 17, 2012.

(51) Int. Cl.
*G06F 1/16* (2006.01)
*H05K 5/02* (2006.01)

(52) U.S. Cl.
CPC ............ *H05K 5/0221* (2013.01); *G06F 1/1616* (2013.01); *G06F 1/1654* (2013.01); *G06F 2200/1637* (2013.01)

(58) Field of Classification Search
CPC .. G06F 1/1616; G06F 1/1632; G06F 1/1654; H05K 5/0221; H02H 3/02
USPC .......... 312/294; 361/679.01, 679.02, 679.09, 361/679.58; 710/303; 736/34; 340/635
See application file for complete search history.

(56) References Cited

U.S. PATENT DOCUMENTS 5,926,627 A 7/1999 Sugimura
2011/0255218 A1* 10/2011 Pakula ................. G06F 1/1626
361/679.01

FOREIGN PATENT DOCUMENTS

TW M407442 7/2011
TW M435639 8/2012

OTHER PUBLICATIONS

"Office Action of Taiwan Counterpart Application", issued on Jan. 20, 2015, p. 1-p. 5.

* cited by examiner

*Primary Examiner* — James O Hansen
(74) *Attorney, Agent, or Firm* — Jianq Chyun IP Office

(57) ABSTRACT

An electronic apparatus and a controlling method thereof are provided. A fastened mechanism of the electronic apparatus is configured to secure a first housing and a second housing of the electronic apparatus. An operating object within a sensing range is sensed via a first sensor unit. A first sensing signal is sent to a control unit when the sensor unit sensed the operating object within the sensing range. A control signal is sent to the fastened mechanism for unlocking the fastened mechanism when the control unit receives the first sensing signal.

22 Claims, 7 Drawing Sheets

ELECTRONIC APPARATUS AND CONTROLLING METHOD THEREOF

CROSS-REFERENCE TO RELATED APPLICATION

This application claims the priority benefits of U.S. provisional application Ser. No. 61/684,137, filed on Aug. 17, 2012. The entirety of the above-mentioned patent application is hereby incorporated by reference herein and made a part of this specification.

TECHNICAL FIELD

The disclosure relates to a controlling method of an electronic apparatus, and more particularly, to an electronic apparatus using a sensor unit to automatically trigger a fastened mechanism to perform unlocking, and a controlling method thereof

BACKGROUND

As technology advances, traditional notebook computer including a host housing and a display housing (pivoted to the host housing) has gradually developed from the technology of having the two bodies tightly abutted together into the technology of enabling the two bodies to be detached from each other. Moreover, by using components such as latches, the host housing and the display housing become detachable from each other.

Currently, the host housing mostly uses a physical button or switch to unlock the latches between the host housing and the display housing. Namely, when a user intends to pick up the display housing, the user has to firstly push the physical button to release the latches in order to pick up the display housing. However, by using the physical button to release the latches, in addition to requiring an extra button pushing action from the user, it is also likely to result in an inadvertent operation, and thus it is very inconvenient.

SUMMARY OF THE DISCLOSURE

The disclosure provides an electronic apparatus using data sensed by two sensor units to automatically control a fastened state between a first housing and a second housing of the electronic apparatus.

The disclosure provides a controlling method of the electronic apparatus enabling a user to easily detach the first housing and the second housing of the electronic apparatus from each other.

The electronic apparatus of the disclosure includes: a fastened mechanism, a control unit, a first sensor unit and a second sensor unit. The fastened mechanism is configured to securely fasten the first housing and the second housing of the electronic apparatus. The control unit is coupled to the fastened mechanism. The first sensor unit is coupled to the control unit, and senses whether an operating object is existed within a sensing range so as to send out a first sensing signal. The second sensor unit is coupled to the control unit, and senses a motion state of the first housing so as to send out a second sensing signal to the control unit. When the control unit receives the first sensing signal, the control unit determines whether a variance of the second sensing signal at a first preset time exceeds a set value. When the variance of the second sensing signal at the first preset time does not exceed the set value, the control unit sends the first control signal to the fastened mechanism to release fastened state between the first housing and the second housing.

In an embodiment of the disclosure, the fastened mechanism includes: a fastened unit and a first drive unit. The first drive unit is coupled to the fastened unit and the control unit, and is configured to drive the fastened unit to perform unlocking or locking.

In an embodiment of the disclosure, when the control unit determines that the variance of the second sensing signal at the first preset time exceeds the set value, the control unit does not send out the first control signal, so that the first housing and the second housing are maintained in the fastened state.

In an embodiment of the disclosure, the second sensor may be a g-sensor.

In an embodiment of the disclosure, the electronic apparatus further includes: a first connector, a second drive unit and a third sensor unit. The first connector is located at the first housing. The second drive unit is coupled to the first connector and the control unit. The third sensor unit is coupled to the first connector and the control unit, and is configured to sense whether the first housing is connected with the second housing.

In an embodiment of the disclosure, when the second drive unit drives the first connector to generate a reverse displacement, the first connector is detached from the second connector on the second housing.

In an embodiment of the disclosure, when the control unit receives the first sensing signal from the first sensor unit, the control unit sends a second control signal to the second drive unit so as to enable the second drive unit to drive the first connector to generate the reverse displacement. Then, after a second preset time has passed, if the third sensor unit continues to sense that the first housing is still connected with the second housing, then the control unit sends a third control signal to the second drive unit so as to enable the second drive unit to drive the first connector to generate the forward displacement, and the control unit drives the fastened mechanism to let the first housing and the second housing are fastened to each other.

In an embodiment of the disclosure, the control unit includes: a power storage device configured to supply power to the control unit when the electronic apparatus enters a sleep mode. Under the sleep mode, when the control unit receives the first sensing signal from the first sensor unit, the control unit drives a power supply unit of the electronic apparatus to supply power to the fastened mechanism.

In an embodiment of the disclosure, the first housing is configured with the control unit and the first sensor unit. The first housing or the second housing is configured with the fastened mechanism, or the first housing and the second housing are each configured with the fastened mechanism.

A controlling method of the electronic apparatus of the disclosure is provided, wherein the electronic apparatus uses the fastened mechanism to securely fasten the first housing and the second housing of the electronic apparatus. The said method includes the following steps: the operating object within the sensing range is sensed by the first sensor unit; when the first sensor unit senses the operating object within the sensing range, the first sensing signal is sent to the control unit; the control unit determines whether the variance of the second sensing signal at the first preset time exceeds the set value, wherein the second sensing signal is sent from the second sensor, and the second sensor is configured to sense the motion state of the first housing; when the variance of the second sensing signal at the first preset time does not exceed the set value, the control unit sends the first control signal to the fastened mechanism to release the fastened state between the first housing and the second housing; and when the variance of the second sensing signal at the first preset time exceeds the set value, the control unit does not send the first control signal, so that the first housing and the second housing are maintained in the fastened state.

When the electronic apparatus of the disclosure is a portable electronic apparatus, then the electronic apparatus of the disclosure includes the fastened mechanism, the control unit and the first sensor unit. The fastened mechanism is configured to securely fasten the portable electronic apparatus and a cradle. The control unit is coupled to the fastened mechanism. The first sensor unit is coupled to the control unit to sense whether the operating object is existed within the sensing range. When the first sensor unit senses the operating object within the sensing range, the first sensing signal is sent to the control unit, and the control unit, after receiving the first sensing signal, sends the first control signal to the fastened mechanism to release the fastened state between the portable electronic apparatus and the cradle.

According to the foregoing, after the sensor unit senses that the user is nearby or in contact with the electronic apparatus, the system of the electronic apparatus sends a signal to enable the fastened mechanism of the electronic apparatus to operate and to unlock the fastened mechanism. Accordingly, the user may easily detach the first housing from the second housing.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

First Embodiment

Figure 1:
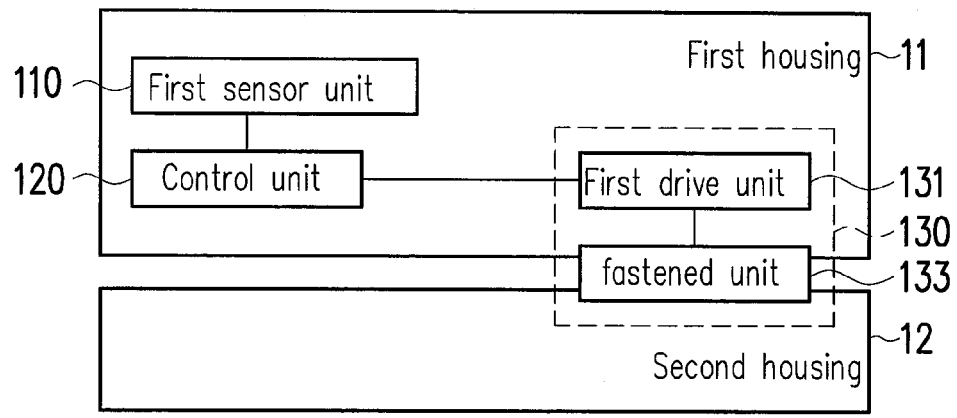
FIG. 1 is a block diagram illustrating an electronic apparatus according to a first embodiment of the disclosure.

FIG. 1 is a block diagram illustrating an electronic apparatus according to a first embodiment of the disclosure. The present embodiment illustrates only the minimum required components while omitting the other components. In FIG. 1, an electronic apparatus 100 including a first housing 11 and a second housing 12 is provided, and the first housing 11 and the second housing 12 are detachable. The first housing 11 is configured with a first sensor unit 110, a control unit 120 and a fastened mechanism 130 therein. In the electronic apparatus 100, the fastened mechanism 130 is used to securely fasten the first housing 11 and the second housing 12. For instance, the first housing 11 is a portable electronic apparatus such as a tablet PC having a display, and the second housing 12 is a cradle. Moreover, the second housing 12 may also be another host having a processing unit, and thereby is capable of independent operation.

Herein, the first housing 11 is configured with the first sensor unit 110, the control unit 120 and the fastened mechanism 130 therein. Moreover, in other embodiments, the fastened mechanism 130 may also be disposed at the second housing 12, or the first housing 11 and the second housing 12 are each configured with a fastened mechanism 130; namely, the electronic apparatus 100 may include two fastened mechanisms 130. However, the location of configuration and the amount of the fastened mechanism 130 are not limited hereto. The fastened mechanism 130 may be disposed at a sidewall of the first housing 11 and at a support structure of the second housing 12.

The control unit 120 is coupled to the first sensor unit 110 and the fastened mechanism 130. The control unit 120, for example, is an embedded chip having operation ability. In other embodiments, the control unit 120 may also be integrated with a processor in the tablet PC that serves as the first housing 11, and uses the processor to execute a various functions of the control unit 120.

The fastened mechanism 130 is configured to securely fasten the first housing 11 and the second housing 12 of the electronic apparatus 100. For instance, the fastened mechanism 130 may include a fastened unit 133 and a first drive unit 131. The first drive unit 131 is coupled to the fastened unit 133 and the control unit 120, and the first drive unit 131 is configured to drive the fastened unit 133 to perform unlocking or locking. The fastened unit 133, for example, is a latch, the first drive unit 131, for example, is a motor. In addition, in other embodiments, the fastened mechanism 130 may also use an electro-rotational mechanical structure such as an electromagnet, instead of the motor.

The first sensor unit 110 senses whether an operating object is existed within a sensing range. The first sensor unit 110, for example, is a capacitive sensor such as a proximity sensor. When the first sensor unit 110 senses the operating object within the sensing range, the first sensor unit 110 sends a first sensing signal to the control unit 120. The control unit 120, after receiving the first sensing signal, sends the first control signal to the fastened mechanism 130 to release the fastened state between the first housing 11 and the second housing 12.

Figure 2:
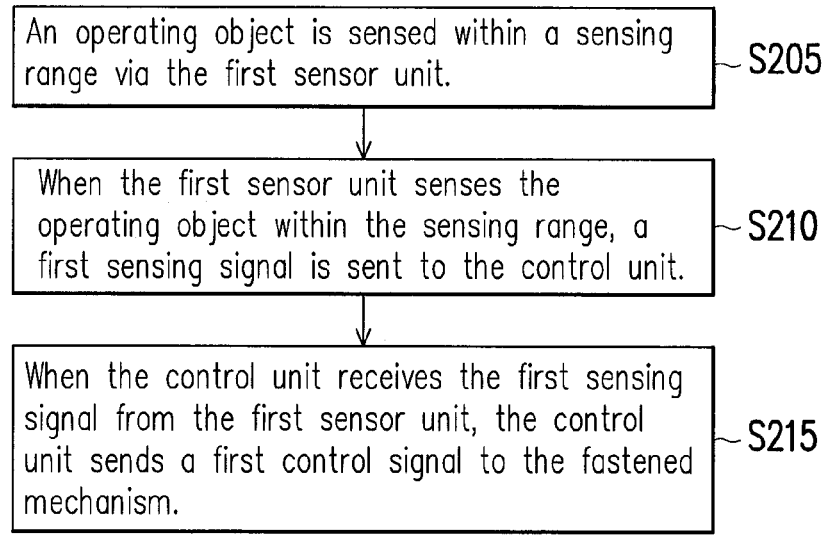
FIG. 2 is a flow diagram illustrating a controlling method of the electronic apparatus according to the first embodiment of the disclosure.

A controlling method of the electronic apparatus 100 is described in the following below. FIG. 2 is a flow diagram illustrating a controlling method of the electronic apparatus according to the first embodiment of the disclosure. Referring to FIG. 1 in conjunction with FIG. 2, in step S205, the operating object is sensed within the sensing range via the first sensor unit 110. Next, in step S210, when the first sensor unit 110 senses the operating object within the sensing range, the first sensing signal is sent to the control unit 120. For instance, when the palm of the user covers the sensing range of the first sensor unit 110, such that when the hand of the user touches a region of the first sensor unit 110 configured within the first housing 11, the first sensor unit 110 would send the first sensing signal to the control unit 120.

Then, in step S215, when the control unit 120 receives the first sensing signal from the first sensor unit 110, the control unit 120 sends the first control signal to the fastened mechanism 130 to release the fastened state between the first housing 11 and the second housing 12. Namely, when the first drive unit 131 receives the first control signal, the fastened unit 133 may be driven to perform unlocking.

If the first housing 11 is used to be a display, the first sensor unit 110 may be disposed above the display (viz. the first housing 11) when the first housing is connected with the second housing 12. When the hand of the user is located within the sensing range of the first sensor unit 110, the first sensing signal sent by the first sensor unit 110, the control unit 120 is able to know that the user is intended to detach the first housing 11 by the first sensing signal from the first sensor unit 110, and thus the control unit 120 sends the first control signal to the first drive unit 131, so as to drive the fastened unit 133 to perform unlocking state. A further example is provided below for describing one of the applications of the present embodiment.

Figure 3:
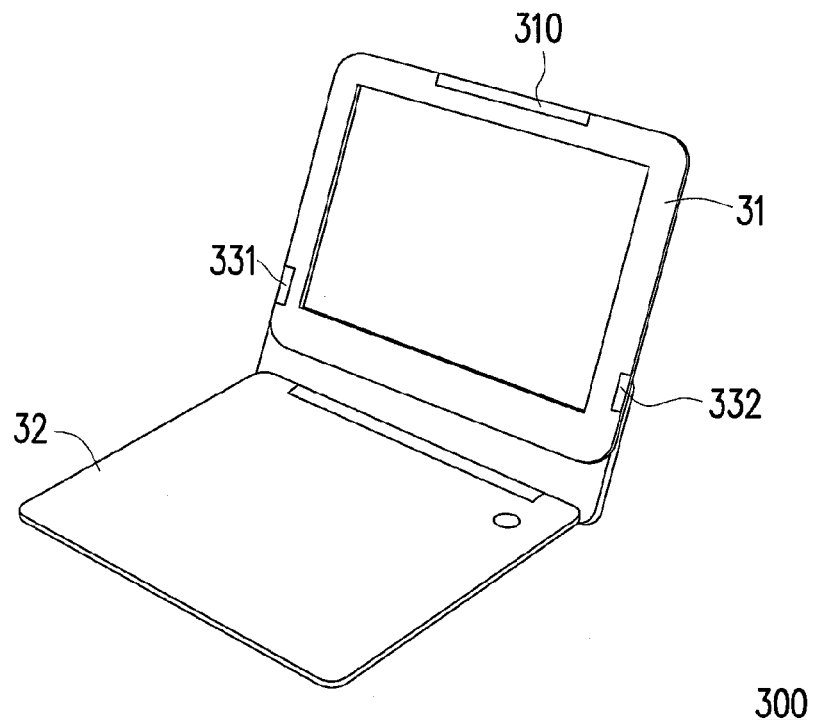
FIG. 3 is a schematic diagram illustrating the electronic apparatus according to the first embodiment of the disclosure.

FIG. 3 is a schematic diagram illustrating the electronic apparatus according to the first embodiment of the disclosure. Referring to FIG. 3, an electronic apparatus 300 includes a tablet PC 31 (first housing) and a cradle 32 (second housing). In this embodiment, the tablet PC 31 may be configured with a first sensor unit 310 and two fastened units 331, 332 therein. As shown in FIG. 3, the first sensor unit 310 is disposed above the tablet PC 31 that serves as a display. Moreover, in other embodiments, the first sensor unit 310 may further be disposed at a user-friendly location which is convenient for the user to detach the tablet PC 31, and the table PC 31 may also be disposed with a plurality of first sensor units. However, the configuration location and the amount of the first sensor unit 310 are not limited hereto. In addition, the electronic apparatus 300 may further be configures with a motor (first drive unit) for driving the two fastened units 331, 332, or be configured with two motors for respectively driving the fastened units 331, 332; however, it is also not limited hereto.

Second Embodiment

Figure 4:
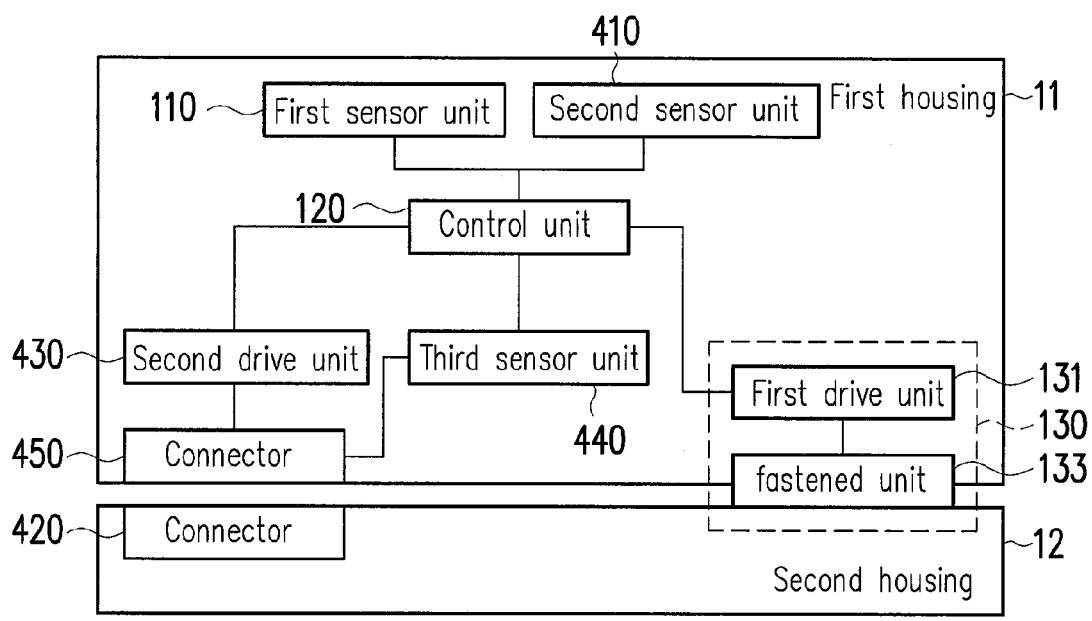
FIG. 4 is a block diagram illustrating an electronic apparatus according to a second embodiment of the disclosure.

Second embodiment is one of the applications of the first embodiment. FIG. 4 is a block diagram illustrating an electronic apparatus according to the second embodiment of the disclosure. Herein, components having the same functions as the ones illustrated in FIG. 1 are represented by the same reference numerals, and the relative descriptions thereof are omitted.

Referring to FIG. 4, the first housing 11 of the electronic apparatus 100 includes the first sensor unit 110, the control unit 120 and the fastened mechanism 130 therein, and further includes the second sensor unit 410 therein. Herein, a second sensor unit 410 is coupled to the control unit 120. The second sensor unit 410, for example, is a motion sensor such as a g-sensor or a gyroscope, and is configured to sense a motion state of the first housing 11, so as to send out the second sensing signal to the control unit 120. Through the second sensor unit 410, it may determine whether the first housing 11 has generated a motion within the first preset time. With the differences in product design, the second sensor unit 410 may also be designed at the second housing 12, but the scope of the disclosure is not limited hereto.

Moreover, a connector 450 (first connector), a second drive unit 430 and a third sensor unit 440 may further be disposed in the second housing 12 of the electronic apparatus 100.

Herein, the third sensor unit 440 is configured to sense whether the first housing 11 is connected with the second housing 12. The third sensor unit 440, for example, is a hall sensor. When the first housing 11 is connected with the second housing 12 (in a coupled state), the third sensor unit 440 is at a logic high level. When the first housing 11 is not connected with the second housing 12 (in a separated state), the third sensor unit 440 is at a logic low level. With the differences in product design, the third sensor unit 440 may also be disposed in the first housing 12, so as to sense a connection status between the first housing 11 and the second housing 12.

The connector 450 may be all sorts of connecting elements and accessories thereof applied to electronic signals and power sources. Moreover, in order to be connected with the connector 450 of the second housing 11, the first housing 12 may also be disposed with another connector 420 (second connector) therein.

The second drive unit 430 is couple to the connector 450 and the third sensor unit 440. Herein, the second drive unit 430, for example, is a motor embedded with a control chip, and thereby the second drive unit 430 may drive the connector 450 to generate a forward displacement or a reverse displacement according to a third sensing signal of the third sensor unit 440.

For instance, the second drive unit 430 determines the connection status, such as being coupled or separated, of the first housing 11 and the second housing 12 via the third sensor unit 440, so as to drive the connector 450 to perform lifting or lowering, namely, to generate the forward displacement or the reverse displacement.

Figure 5:
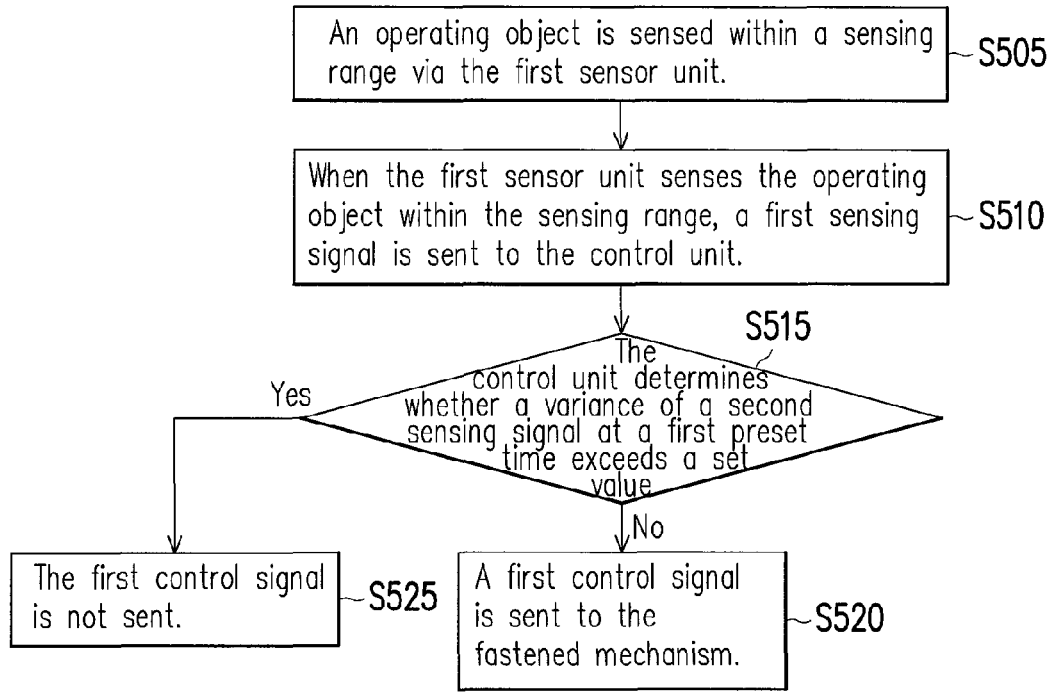
FIG. 5 is a flow diagram illustrating a controlling method of the electronic apparatus according to the second embodiment of the disclosure.

Moreover, the following below, each respective step of a controlling method of the electronic apparatus in FIG. 5 is further described. FIG. 5 is a flow diagram illustrating the controlling method of the electronic apparatus according to the second embodiment of the disclosure. In the present embodiment, the control unit 120 has a firmware therein, and a plurality of code fragments is stored in the firmware for enabling the control unit 120 to execute a plurality of steps. In addition, in the present method, the fastened mechanism 130 is assumed to be currently in the locking state; namely, the first housing 11 and the second housing 12 are in the coupled state.

Referring to FIG. 4 and FIG. 5, in step S505, the operating object is sensed within the sensing range via the first sensor unit 110. When the first sensor unit 110 senses the operating object within the sensing range, as shown in step S510, the first sensing signal is sent to the control unit 120. If the control unit 120 does not receive the first sensing signal from the first sensor unit 110, then the fastened mechanism 130 is maintained in the locking state to let the first housing 11 and the second housing 12 are fastened to each other.

After the control unit 120 receives the first sensing signal from the first sensor unit 110, step S515 is executed; the control unit 120 determines whether the variance of the second sensing signal at the first preset time exceeds the set value. The second sensing signal is sent out from the second sensor 410, which is configured to sense the motion state of the first housing 11.

Specifically, the control unit 120, when receiving the first sensing signal, may further determine whether the first housing 11 has generate a motion within the first preset time via the second sensing signal of the second sensor unit 410. The aforesaid first preset time serves as a buffer time for the user to consider whether to detach the first housing 11 or not, such that the first preset time may be set as 1 second, 2 seconds, 3 seconds or other set time. For instance, when the hand of the user touches the first sensor unit 110 that includes a single or a plurality of capacitive sensors, the control unit 120 is triggered to read the second sensing signal of the second sensor unit 410. Otherwise, the second sensor unit 410 may also self send the second sensing signal to the control unit 120.

When the variance of the second sensing signal at the first preset time exceeds the set value, such that the first housing 11 generates a motion such as a movement or a rotation within the first preset time, then it indicates that the user merely adjusts the position of the first housing 11 instead of detaching the first housing 11; and therefore, step S525 is executed; the control unit 120 does not send out the first control signal, so that the first housing 11 and the second housing 112 are maintained in the locking state to let the first housing 11 and the second housing 12 are fastened to each other. On the other hand, when the variance of the second sensing signal at the first preset time does not exceed the set value, such that the first housing 11 does not generate any motion within the first preset time, then step S520 is executed; the control unit 120 sends the first control signal to the fastened mechanism 130 to release the fastened state between the first housing 11 and the second housing 12. For instance, when the user touches the first sensor unit 110 for more than 2 seconds (exceeding the first preset time) and has no intention to adjust the angle of the first housing 11, then the control unit 120 determines that the user intends to detach the first housing 11 from the second housing 12, and thereby unlocks the fastened mechanism 130. Now, the fastened mechanism 130 is in an unlocked state.

Moreover, when the control unit 120 sends the first control signal to the fastened mechanism 130, the control unit 120 may also send a second control signal to the second drive unit 430 corresponding to the connector 450, so that the second drive unit 430 drives the connector 450 to generate the reverse displacement, such as to recover the connector 420. One example is provided below to illustrate a lifting and lowering method of the connector 450.

Figure 6:
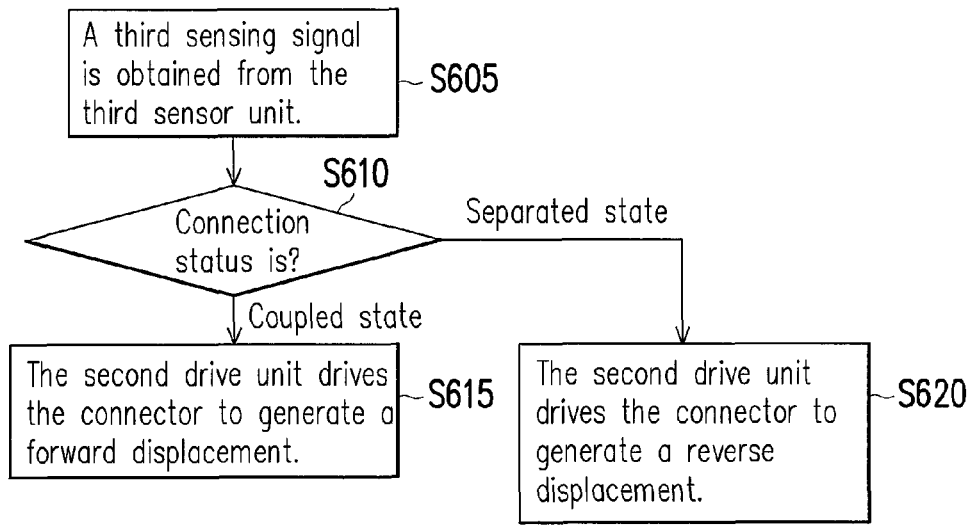
FIG. 6 is a flow diagram illustrating a lifting and lowering method of a connector according to the second embodiment of the disclosure.

FIG. 6 is a flow diagram illustrating the lifting and lowering method of the connector according to the second embodiment of the disclosure. Referring to FIG. 4 and FIG. 6, in step S605, the control unit 120 may obtain the third sensing signal from the third sensor unit 440. Afterward, in step S610, the control unit 120 determines the current connection status according to the third sensing signal of the third sensor unit 440, namely, determines whether the connection status is at the coupled state or the separate state according to whether the third sensing signal is at the logic high lever or the logic low level. Herein, the logic high level represents the coupled state, and the logic low level represents the separated state. However, the above is only taken as an example, and the disclosure is not limited hereby.

When the first housing 11 and the second housing 12 are in the coupled state, in step S615, the control unit 610 controls the second drive unit 430 to drive the connector 450 to generate the forward displacement, for example, to push the connector 450 outside of the first housing 11. When the first housing 11 and the second housing 12 are in the separated state, in step S620, the control unit 610 controls the second drive unit 430 to drive the connector 450 to generate the reverse displacement, for example, to recover the connector 450 into the first housing 11. Through the abovementioned method, the connector 450 can automatically be lifted and lowered.

When the first housing 11 is ready to be coupled to the second housing 12 and in contact with the second housing 12, the third sensor unit 440 sends the third sensing signal to the control unit 120, and the control unit 120 respectively sends the first control signal and a third control signal to the first drive unit 131 and the second drive unit 430 according to the third sensing signal. The first drive unit 131, after receiving the first control signal, drives the first fastened unit 133 to perform a latching action so as to fix the first housing 11 and the second housing 12 with each other. The second drive unit 430, after receiving the third control signal, drives the connector 450 to generate the forward displacement to combine with the connector 420 on the first housing 12, so that the first housing 11 and the second housing 12 may use the connectors 420, 450 to transmit data, mutually.

Accordingly, in the present embodiment, the first sensor unit 110 and the second sensor unit 120 are used to determine the user status and action before the actions for unlocking the fastened mechanism and lifting or lowering the connector 450 are performed. Namely, one or more first sensor units 110 are used to sense the location of the operating object (e.g., hand), and at least one second sensor unit 410 is used to determine whether the first housing 11 generates a motion such as rotation or movement, so as to determine whether the user intends to open or close the first housing 11, or intends to perform the unlocking. Therefore, the first housing 11 and the second housing 12 may be easily and smoothly detached.

In other embodiments, the first housing 12 may also be disposed with a drive unit corresponded to the connector 420 therein, so as to control the lifting and the lowering of the connector 420 of the second housing 12. For instance, when the control unit 120 receives the first sensing signal from the first sensor unit 110, and under the condition that the first housing 11 is not yet detached from the second housing 12 and the control unit 120 may still send the second control signal to the drive unit corresponding to the connector 420 through a transmission path between the connector 450 and the connector 420, the control unit 120 may send the second control signal to the drive unit corresponding to the connector 420 via the said transmission path, so that the drive unit may drive the connector 420 to generate the reverse displacement.

Further examples are provided below for illustrating an implementation of the electronic apparatus 100 of FIG. 4. In the following below, a tablet PC is taken as the first housing 11, a cradle is taken as the second housing 12, a capacitive sensor is taken as the first sensor unit 110, a g-sensor is taken as the second sensor 410, a hall sensor is taken as the third sensor unit 430, and a latch is taken as the fastened unit 133.

Figure 7A:
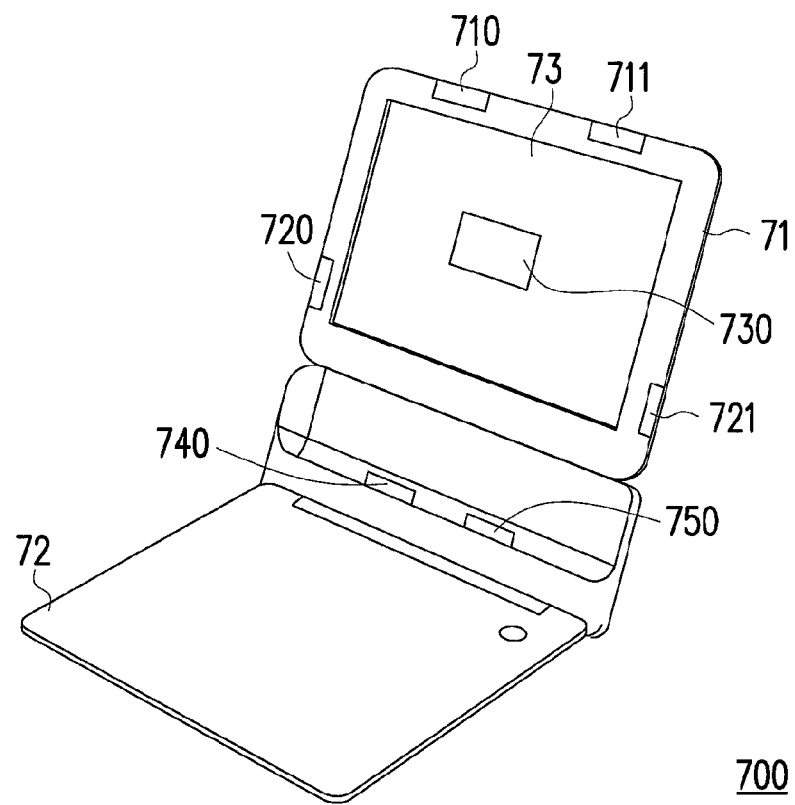
FIG. 7A and FIG. 7B are schematic diagrams illustrating the electronic apparatus according to the second embodiment of the disclosure.
Figure 7B:
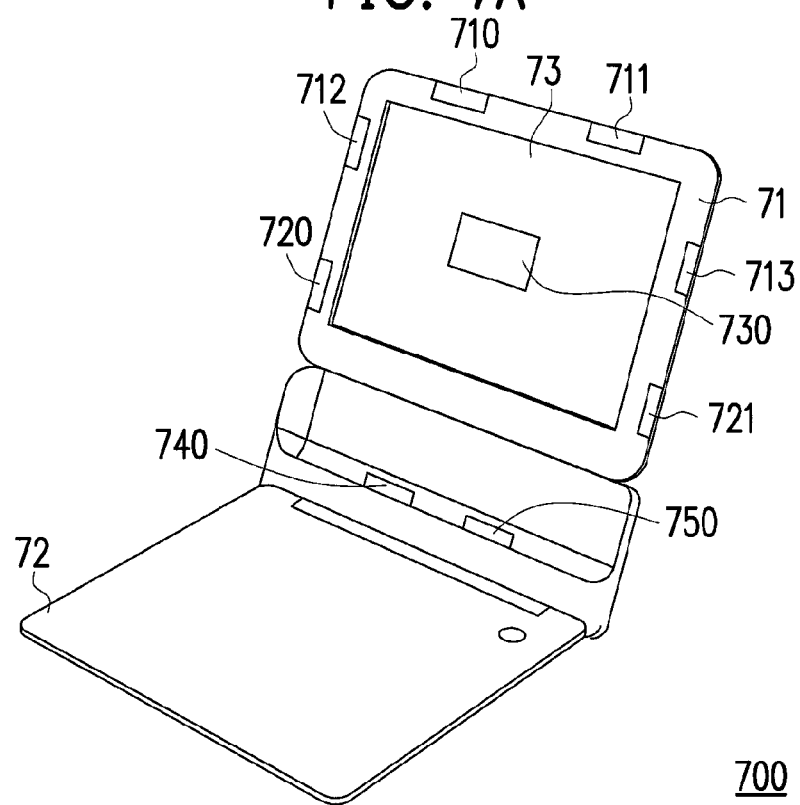

FIG. 7A and FIG. 7B are schematic diagrams illustrating the electronic apparatus according to the second embodiment of the disclosure. Referring to FIG. 7A and FIG. 7B, an electronic apparatus 700 includes a tablet PC 71 and a cradle 72. In FIG. 7A, in the tablet PC 71, two capacitive sensors 710, 711 are disposed thereon and two latches 720, 721 are respectively disposed on the left and right thereof, and in a g-sensor 730 is further disposed at the location of a display 73. In the cradle 72, a connector 750 and a hole sensor 740 are disposed therein. Moreover, in FIG. 7B, the electronic apparatus 700 may additionally be configured with two capacitive sensors 712, 713 at the left and right sides of the tablet PC 71. In the present embodiment, the first drive units of the latches 720, 721 and the second drive unit of the connector 750 are omitted.

Third Embodiment

Figure 8:
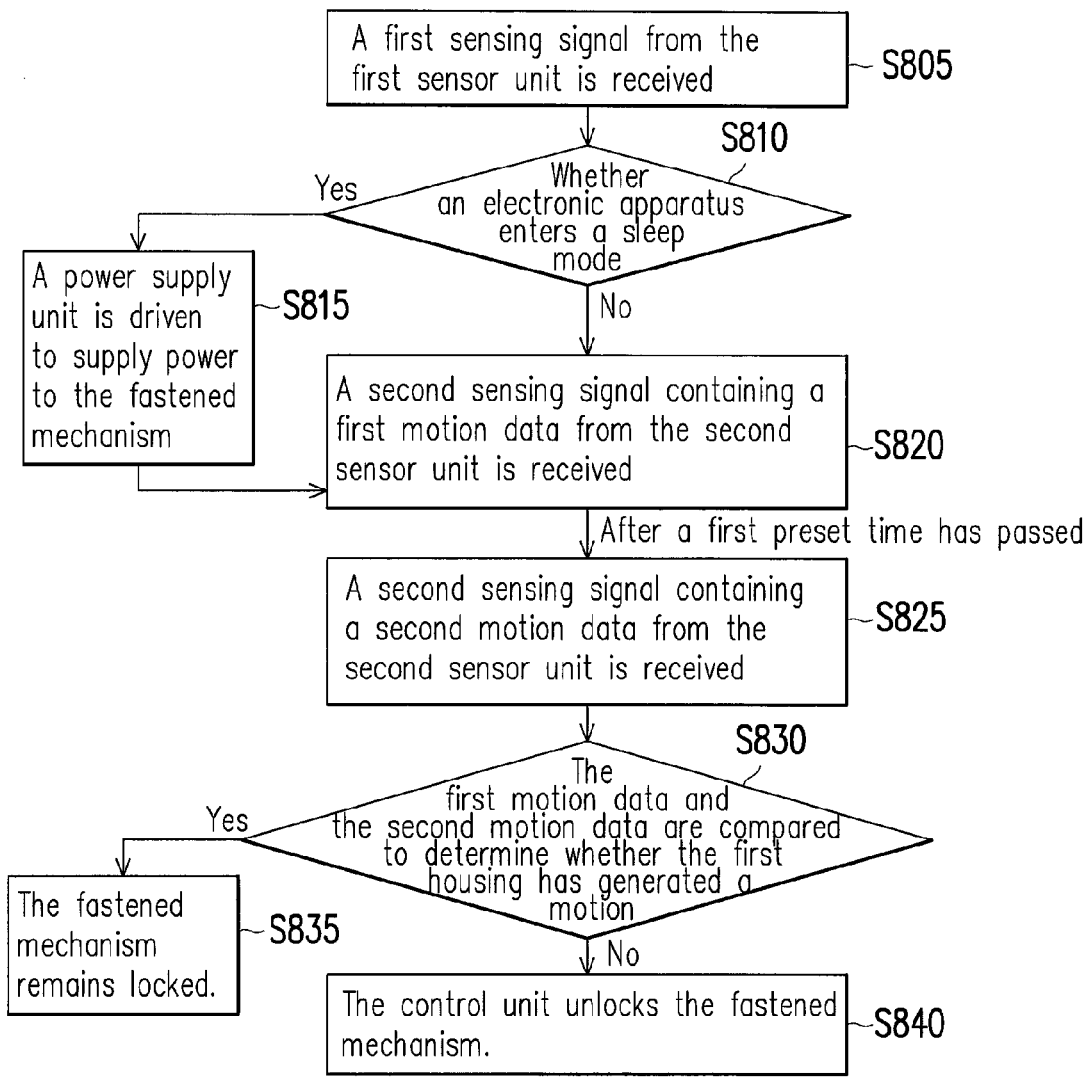
FIG. 8 is a flow diagram illustrating a controlling method of an electronic apparatus according to a third embodiment of the disclosure.

Third embodiment is one of the applications of the first embodiment for illustrating a controlling method of the electronic apparatus 100 when the electronic apparatus 100 is in a sleep mode, and one embodiment within the step S515 of the second embodiment is further described with an example. FIG. 8 is a flow diagram illustrating a controlling method of an electronic apparatus according to the third embodiment of the disclosure. In the following below, further descriptions, accompanied by FIG. 4, are provided.

Referring to FIG. 4 in conjunction with FIG. 8, in step S805, the control unit 120 receives the first sensing signal from the first sensor unit 110. Next, in step S810, the control unit 120 determines whether the electronic apparatus 100 enters the sleep mode. Herein, the control unit 120, for example, is disposed with a power storage device (not shown); and during the sleep mode, power is supplied by the power storage device to the control unit 120, the first sensor unit 110 and the second sensor unit 410; as such, during the sleep mode, the control unit 120, the first sensor unit 110 and the second sensor unit 410 are still operational. Moreover, in other embodiments, the first sensor unit 110 and the second sensor unit 410 may also each be disposed with a power storage device.

If the electronic apparatus 100 enters the sleep mode, in step S815, the control unit 120 drives a power supply unit (not shown) of the electronic apparatus 100 to supply power to the fastened mechanism 130. Afterward, the control unit 120 continues to execute step S820. If the electronic apparatus 100 does not enter the sleep mode, then the step S820 is directly executed.

In the step S820, the control unit 120 receives the second sensing signal containing a first motion data from the second sensor unit 410. Herein, the first motion data serves as a baseline for a follow-up comparison. Next, after the first preset time has passed, in step S825, the control unit 120 receives the second sensing signal containing a second motion data from the second sensor unit 410. Then, in step S830, the control unit 120 further compares the first motion data with the second motion data, so as to determine whether the first housing 11 has generated a motion.

When a variance between the first motion data and the second motion data exceeds the set value, it indicates that the first housing 11 has generated a motion such as a movement or a rotation, then step S835 is executed; the fastened mechanism 130 remains locked, namely, the control unit 120 does not send the first control signal (signal for unlocking) to the fastened mechanism 130. When the variance between the first motion data and the second motion data does not exceed the set value, it indicates that the first housing 11 does not generate any motion, such as a movement or a rotation, within the first preset time, then step S840 is executed; the control unit 120 sends the first control signal to the fastened mechanism 130 to release the fastened state between the first housing 11 and the second housing 12.

Figure 9:
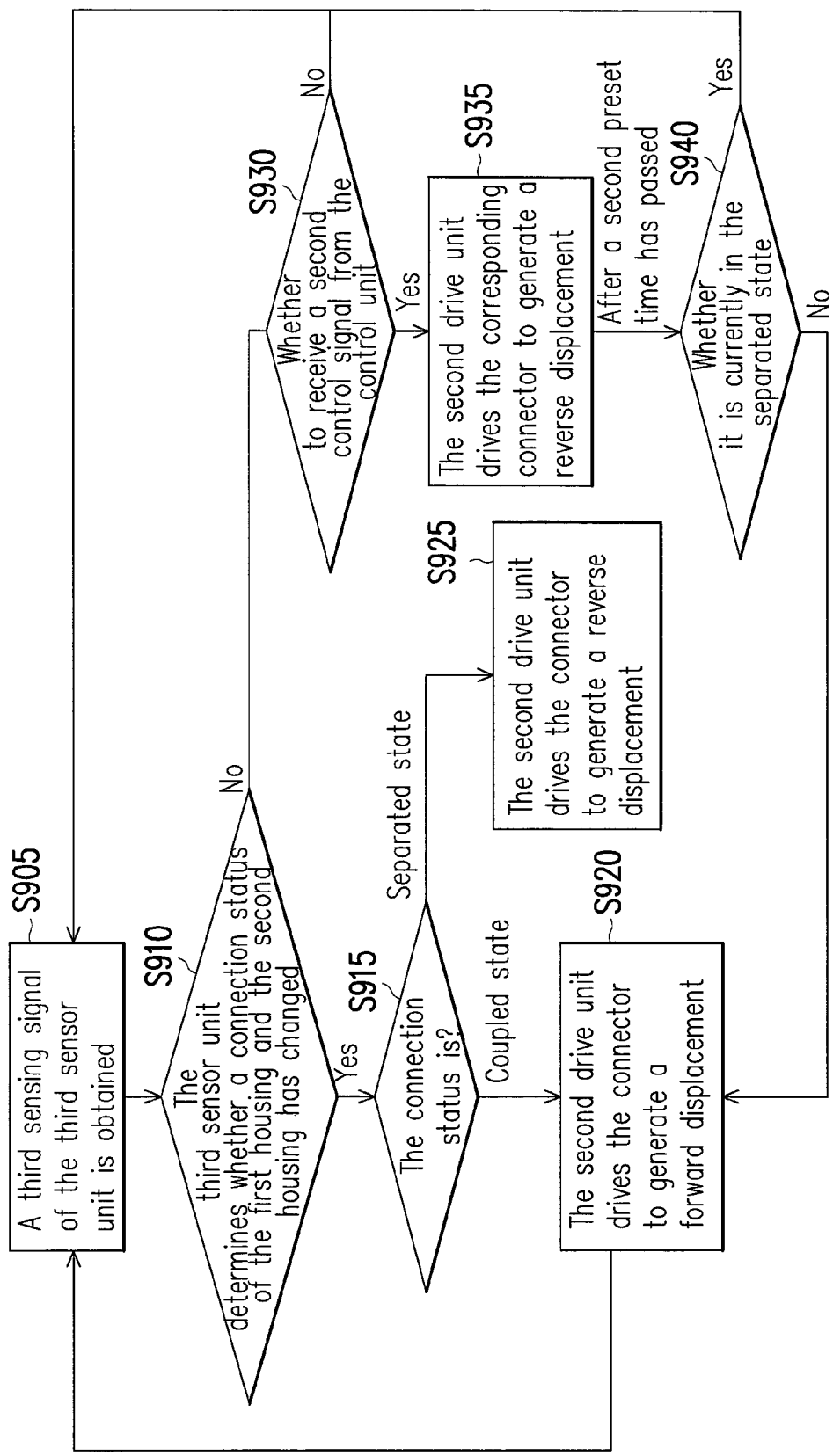
FIG. 9 is a flow diagram illustrating a lifting and lowering method of a connector according to a fourth embodiment of the disclosure.

Moreover, another mechanism setting may further be performed to the electronic apparatus 100, such that, after the fastened mechanism 130 is unlocked, if the second preset time has passed and the first housing 11 is still connected with the second housing 12, then the fastened mechanism 130 is to be locked up again. For instance, when the palm of the user stays at the first sensor unit 110 for more than the first preset time (e.g. 2 seconds), then the fastened mechanism 130 is to be unlocked, but if after the second preset time (e.g., 3 seconds) has passed and the first housing 11 is still connected with the second housing 12, then the fastened mechanism 130 is to be immediately locked up again. Specifically, after the second preset time has passed, when the third sensor unit 440 senses that the first housing 11 is still connected with the second housing 12, the control unit 120 sends the third control signal to the second drive unit 430, so that the second drive unit 430 drives the connector 450 to generate the forward displacement (e.g., to push the connector 450 outside of the first housing 11). Additionally, by using the control unit 120 to drive the fastened mechanism 130, the first housing 11 and the second housing 12 are appeared in the fastened state, Fourth Embodiment Fourth embodiment is one of the applications of the first embodiment for illustrating another embodiment for lifting and lowering the connector 420. FIG. 9 is a flow diagram illustrating a lifting and lowering method of the connector according to the fourth embodiment of the disclosure. In the following below, further descriptions of the electronic apparatus 100 of FIG. 4 are provided.

Referring to FIG. 4 and FIG. 9, in step S905, the control unit 120 obtains the third sensing signal of the third sensor unit 440. Next, in step S910, the control unit 120 determines whether the connection status of the first housing 11 and the second housing 12 has changed by the third sensor unit 440. Herein, the connection status is the coupled state or the separated state. The so-called coupled state indicates that the first housing 11 and the second housing 12 are connected, and the separated state indicates that the first housing 11 is detached from the second housing 12. For instance, when it is changed from the coupled state to the separated state, the third sensing signal of the third sensor unit 440 is changed from the logic high level to the logic low level. Or, when it is changed from the separated state to the coupled state, the third sensing signal of the third sensor unit 440 is changed from the logic low level to the logic high level.

If the connection status of the first housing 11 and the second housing 12 is changed, then step S915 is executed; the control unit 120 determines the current connection status. For instance, when the third sensing signal is currently at the logic high level, the connection status is determined as being the coupled state; when the third sensing signal is at the logic low level, the connection status is determined as being the separated state. When the connection status being the coupled state, the control unit 120 sends the third control signal to the second drive unit 430, so as to enable the second drive unit 430 to drive the corresponding connector 450 to generate the forward displacement, as shown in step S920. When the connection status being the separated state, the control unit 120 sends the second control signal to the second drive unit 430, so as to enable the second drive unit 430 to drive the connector 450 to generate the reverse displacement, as shown in step S925.

Moreover, in the step S910, if the connection status is not changed, such as being maintained in the coupled state or being maintained in the separated state, then step S930 is executed; the second drive unit 430 determines whether to receive the second control signal from the control unit 120.

If the second control signal from the control unit 120 is not received, then the step S905 is re-executed. If the second control signal from the control unit 120 is received, then step S935 is executed; the second drive unit 430 drives the corresponding connector 450 to generate the reverse displacement. Namely, when the first sensor unit 110 senses the operating object within the sensing range and sends the first sensing signal to the control unit 120, i.e., when the control unit 120 receives the first sensing signal, the control unit 120 further sends the second control signal to the second drive unit 430 corresponding to the connector 450, so as to enable the second drive unit 430 to drive the connector 450 to generate the reverse displacement.

Then, after the second preset time has passed, step S940 is executed; the control unit 120 determines whether it is currently in the separated state. If the first housing 11 and the second housing 12 are already separated, then the step S905 is re-executed. If after the second preset time has passed, and when the third sensor unit 440 senses that the first housing 11 and the second housing 12 are still connected, then the control unit 120 may further send the third control signal to the second drive unit 430, so as to enable the second drive unit 430 to drive the corresponding connector 450 to generate the forward displacement, as shown in The step S920. Moreover, currently, the control unit 120 may also drive the first drive unit 131 to lock the fastened unit 133.

Although the second drive unit 430 and the third sensor unit 440 of the above embodiments are configured at the first housing 11, in other embodiments, the second drive unit 430 and the third sensor unit 440 may also be configured at the second housing 12, or be simultaneously configured at the first housing 11 and the second housing 12, according to the usage requirements, and the disclosure is not limited hereby. In the following below, a further example is provided for illustrating an embodiment, in which the second drive unit 430 (for driving the connector 420) and the third sensor unit 440 are configured at the second housing 12.

Fifth Embodiment

Figure 10:
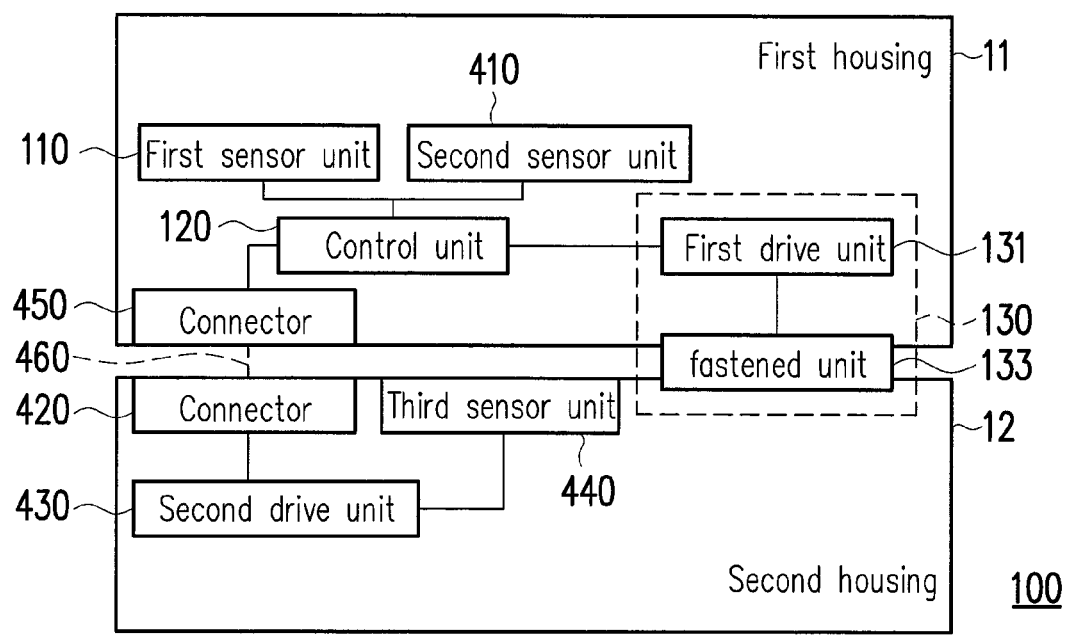
FIG. 10 is a block diagram illustrating an electronic apparatus according to a fifth embodiment of the disclosure.

FIG. 10 is a block diagram illustrating an electronic apparatus according to a fifth embodiment of the disclosure. Herein, components having the same functions as the ones in FIG. 4 are presented by the same reference numerals, and thereby descriptions for the same functions may be referred to FIG. 4 in above. In the following below, only the differences are described.

In FIG. 10, when the connector 450 of the first housing 11 and the connector 420 of the second housing 12 are connected, the control unit 120 may be coupled to the second drive unit 430 and the third sensor unit 440 via a transmission path 460 between the connector 450 and the connector 420. As such, the first housing 11 and the second housing 12 may use the connectors 420, 450 to transmit data, mutually.

Moreover, in the fifth embodiment, the second drive unit 430 disposed in the second housing 12 is unable to receive any signal from the control unit 120 through the transmission path 460 between the connector 420 and the connector 450 when the first housing 11 and the second housing 12 are in the separated state, and thus the second drive unit 430 may determine by the third sensing signal of the third sensor unit 440 to drive the connector 420 to generate the forward displacement or the reverse displacement.

For instance, if the second drive unit 430, after obtaining the third sensing signal of the third sensor unit 440, determines that the first housing 11 and the second housing 12 are in the separated state, then the second drive unit 430 directly drives the connector 420 to generate the reverse displacement. When the control unit 120 receives the first sensing signal from the first sensor unit 110, and under the condition that the first housing 11 and the second housing 12 are in the coupled state, the control unit 120 may send the second control signal (or the third control signal) to the second drive unit 430 corresponding to the connector 420 through the transmission path 460, so as to enable the second drive unit 430 to drive the connector 420 to generate the reverse displacement (or the forward displacement). Accordingly, the connector 420 can also be automatically lifted or lowered.

In summary, in the disclosure, after the first sensor unit senses the operating object is nearby or in contact with the electronic apparatus, the control unit sends the first control signal to the first drive unit of the fastened mechanism, so as to enable the fastened mechanism to be unlocked. In addition, the control unit may also simultaneously send the second control signal to the second drive unit of the connector, so as to enable the connector to be lowered. Accordingly, the user may easily detach the first housing from the second housing. As a result, the first housing or the second housing does not have to be configured with a physical switch for unlocking the fastened mechanism, thereby providing a more concise appearance. Moreover, the user may detach the first housing from the second housing without taking action to trigger the physical switch. Furthermore, with an intelligent judgment of the sensor unit, the electronic apparatus can auto-sense the intention of the user, and thereby a problem of inadvertently triggering the physical switch may be reduced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An electronic apparatus, comprising:
   a fastened mechanism, securely fastening a first housing and a second housing of the electronic apparatus;
   a control unit, coupled to the fastened mechanism;
   a first sensor unit, coupled to the control unit, sensing whether an operating object is existed within a sensing range so as to send out a first sensing signal; and
   a second sensor unit, coupled to the control unit, sensing a motion state of the first housing so as to send out a second sensing signal to the control unit;
   wherein, when the control unit receives the first sensing signal, the control unit determines whether a variance of the second sensing signal at a first preset time exceeds a set value, and when the variance of the second sensing signal at the first preset time does not exceed the set value, the control unit sends a first control signal to the fastened mechanism to release a fastened state between the first housing and the second housing.

2. The electronic apparatus as recited in claim 1, wherein the fastened mechanism comprises:
   a fastened unit; and
   a first drive unit, coupled to the fastened unit and the control unit, driving the fastened unit to perform unlocking or locking.

3. The electronic apparatus as recited in claim 1, wherein when the control unit determines that the variance of the second sensing signal at the first preset time exceeds the set value, the control unit does not send out the first control signal, so that the first housing and the second housing are maintained in the fastened state.

4. The electronic apparatus as recited in claim 3, wherein the second sensor is a g-sensor.

5. The electronic apparatus as recited in claim 1 further comprising:
- a first connector, located at the first housing;
- a second drive unit, coupled to the first connector and the control unit; and
- a third sensor unit, coupled to the first connector and the control unit for sensing whether the first housing is connected with the second housing.

6. The electronic apparatus as recited in claim 5, wherein when the second drive unit drives the first connector to generate a reverse displacement, the first connector is detached from a second connector on the second housing.

7. The electronic apparatus as recited in claim 5, wherein when the control unit receives the first sensing signal from the first sensor unit, the control unit sends a second control signal to the second drive unit so as to enable the second drive unit to drive the first connector to generate a reverse displacement; and then, after a second preset time has passed, if the third sensor unit continues to sense that the first housing is still connected with the second housing, the control unit sends a third control signal to the second drive unit so as to enable the second drive unit to drive the first connector to generate a forward displacement, and the control unit drives the fastened mechanism to let the first housing and the second housing are fastened to each other.

8. The electronic apparatus as recited in claim 1, wherein the control unit comprises:
- a power storage device, supplying power to the control unit when the electronic apparatus enters a sleep mode;
- wherein, under the sleep mode, the control unit drives a power supply unit of the electronic apparatus to supply power to the fastened mechanism when the control unit receives the first sensing signal from the first sensor unit.

9. The electronic apparatus as recited in claim 1, wherein the first housing is configured with the control unit and the first sensor unit; and
the first housing or the second housing is configured with the fastened mechanism, or the first housing and the second housing are each configured with the fastened mechanism.

10. A controlling method of an electronic apparatus, the electronic apparatus using a fastened mechanism to secure a first housing and a second housing of the electronic apparatus, the controlling method comprising:
- sensing an operating object within a sensing range via a first sensor unit;
- sending a first sensing signal to a control unit when the first sensor unit senses the operating object within the sensing range; and
- determining whether a variance of the second sensing signal at a first preset time exceeds a set value first preset time via the control unit, wherein the second sensing signal is sent out from a second sensor and the second sensor is configured to sense a motion state of the first housing;
    - when the variance of the second sensing signal at the first preset time does not exceed the set value, sending a first control signal via the control unit to the fastened mechanism to release a fastened state between the first housing and the second housing; and
    - when the variance of the second sensing signal at the first preset time exceeds the set value, maintaining the first housing and the second housing in the fastened state by not sending the first control signal via the control unit.

11. The controlling method of an electronic apparatus as recited in claim 10, wherein the second sensor is a g-sensor.

12. The controlling method of an electronic apparatus as recited in claim 10, wherein when the control unit receives the first sensing signal from the first sensor unit, further comprising:
- sending a second control signal to a drive unit corresponding to a first connector via the control unit, so that the drive unit drives the first connector to generate a reverse displacement, wherein the first connector is located at the first housing and is configured to connect with a second connector located at the second housing.

13. The controlling method of an electronic apparatus as recited in claim 12, wherein after sending the second control signal to the drive unit corresponded by the first connector via the control unit to enable the drive unit to drive the first connector to generate the reverse displacement, further comprising:
- after a second preset time has passed, and when the first housing is sensed by a third sensor unit as to be still connected with the second housing,
    - sending a third control signal to the drive unit via the control unit to enable the drive unit to drive the first connector to generate a forward displacement; and
    - driving the fastened mechanism via the control unit to let the first housing and the second, housing are fastened to each other.

14. The controlling method of an electronic apparatus as recited in claim 10, wherein when the first sensor unit senses the operating object within the sensing range, if the electronic apparatus is in a sleep mode, then the control unit drives a power supply unit of the electronic apparatus to supply power to the fastened mechanism.

15. An electronic apparatus, configured to be a portable electronic apparatus, comprising:
- a fastened mechanism, securely fastening the electronic apparatus and a cradle;
- a control unit, coupled to the fastened mechanism;
- a first sensor unit, coupled to the control unit, sensing whether an operating object exists within a sensing range; and
- a power storage device, supplying power to the control unit and the first sensor unit when the electronic apparatus enters a sleep mode, such that the control unit and the first sensor unit are still operable during the sleep mode,
- wherein, when the first sensor unit senses the operating object within the sensing range, sends a first sensing signal to the control unit and the control unit, and after the control unit receives the first sensing signal, sends a first control signal to the fastened mechanism to release the fastened state between the electronic apparatus and the cradle.

16. The electronic apparatus as recited in claim 15, wherein the fastened mechanism comprises:
- a fastened unit; and
- a first drive unit, coupled to the fastened unit and the control unit, driving the fastened unit to perform unlocking or locking.

17. The electronic apparatus as recited in claim 15 further comprising:
- a second sensor unit, coupled to the control unit, sensing the motion of the electronic apparatus so as to send out a second sensing signal;
- wherein, the control unit, after receiving the second sensing signal, determines whether a variance of the second sensing signal at a first preset time exceeds a set value; when the variance of the second sensing signal at the first preset time does not exceed the set value, the control unit sends the first control signal to the fastened mechanism to release the fastened state between the electronic apparatus and the cradle; when the variance of the second sensing signal at the first preset time exceeds the set value, the control unit does not send out the first control signal, so that the electronic apparatus and the cradle are maintained in the fastened state.

18. The electronic apparatus as recited in claim 17, wherein the second sensor is a g-sensor.

19. The electronic apparatus as recited in claim 15 further comprising:
   a first connector;
   a second drive unit, coupled to the first connector and the control unit; and
   a third sensor unit, coupled to the first connector and the control unit so as to sense whether the electronic apparatus is in contact with the cradle.

20. The electronic apparatus as recited in claim 19, wherein when the second drive unit drives the first connector to generate a reverse displacement, the first connector is detached from a second connector on the cradle.

21. The electronic apparatus as recited in claim 19, wherein when the control unit receives the first sensing signal from the first sensor unit, sends a second control signal to the second drive unit so as to enable the second drive unit to drive the first connector to generate a reverse displacement; and then, after a second preset time has passed, if the third sensor unit continues to sense that the electronic apparatus is still connected with the cradle, the control unit send a third control signal to the second drive unit so as to enable the second drive unit to drive the first connector to generate a forward displacement, and the control unit drives the fastened mechanism to let the electronic apparatus and the cradle are fastened to each other.

22. The electronic apparatus as recited in claim 15,
   wherein, under the sleep mode, the control unit drives a power supply unit of the electronic apparatus to supply power to the fastened mechanism when the control unit receives the first sensing signal from the first sensor unit.

* * * * *